United States Patent
Yamamoto

(10) Patent No.: US 7,633,016 B2
(45) Date of Patent: Dec. 15, 2009

(54) COUPLING STRUCTURE BETWEEN CIRCUIT BOARD AND FRAME MEMBER

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 336 days.

(21) Appl. No.: 11/714,394

(22) Filed: Mar. 5, 2007

(65) Prior Publication Data

US 2007/0215382 A1    Sep. 20, 2007

(30) Foreign Application Priority Data

Mar. 17, 2006    (JP)    ............................. 2006-075195

(51) Int. Cl.
*H01R 12/04*    (2006.01)
(52) U.S. Cl. ................. 174/263; 174/259; 174/255; 174/256; 361/760
(58) Field of Classification Search ......... 361/760–767, 361/772–774, 776, 803; 174/259, 260–264, 174/250, 255, 256; 438/612; 257/685, 686, 257/723, 724, 726, 777, 778

See application file for complete search history.

(56) References Cited

U.S. PATENT DOCUMENTS

| 3,624,587 | A | * | 11/1971 | Conrad | ........................ 439/65 |
| 3,638,734 | A | * | 2/1972 | Ault | ............................ 428/608 |
| 4,423,467 | A | * | 12/1983 | Shaheen | ...................... 361/767 |
| 6,239,012 | B1 | * | 5/2001 | Kinsman | .................... 438/612 |
| 7,282,789 | B2 | * | 10/2007 | Kinsman | .................... 257/685 |

FOREIGN PATENT DOCUMENTS

| JP | 6-104580 | 4/1994 |
| JP | 10-341087 | 12/1998 |

* cited by examiner

*Primary Examiner*—Dean A. Reichard
*Assistant Examiner*—Hoa C Nguyen
(74) *Attorney, Agent, or Firm*—Beyer Law Group LLP

(57) ABSTRACT

A coupling structure between a circuit board and a frame member according to the present invention includes: the frame member made of a metal material; and the circuit board set in the frame member and having a land portion soldered to the frame member, in which a solder reinforcing member that is put on the land portion and is solderable is provided at a corner formed by the frame member and the circuit board, and the frame member, the land portion, and the solder reinforcing member are soldered at the corner.

5 Claims, 2 Drawing Sheets

COUPLING STRUCTURE BETWEEN CIRCUIT BOARD AND FRAME MEMBER

BACKGROUND OF THE INVENTION

1. Field of the Invention

The present invention relates to a coupling structure between a circuit board and a frame member, which is suitable for various electrical devices or electronic circuit units.

2. Description of the Related Art

FIG. 4 is a perspective view of a main portion of a conventional coupling structure between a circuit board and a frame member. Referring now to FIG. 4, the conventional coupling structure between a circuit board and a frame member is described. A frame member 51 is made of a rectangular metal material, and has an L-shaped tongue 51a that is cut out and bent toward an inner portion of the frame member 51 and an opening 51b formed by cutting out the tongue 51a.

A circuit board 52 has a cut-out 52a opposite to the tongue 51a. In addition, a wiring pattern 53 is formed on the circuit board 52. A land portion 53a formed at the end of the wiring pattern 53 extends up to the cut-out 52a.

The circuit board 52 is set in the frame member 51. Under such conditions that the tongue 51a is positioned in the cut-out 52a, a solder 54 applied to a corner formed by the tongue 51a and the circuit board 52 bonds the frame member 51 to the land portion 53a to thereby complete the conventional coupling structure between a circuit board and a frame member (see Japanese Unexamined Patent Application Publication No. 10-341087, for instance).

However, the conventional coupling structure between a circuit board and a frame member has a problem in that a capillarity effect of the solder 54 applied to the corner formed by the tongue 51a and the circuit board 52 is lowered, and the solder 54 flows more toward the inner portion of the frame member 51 to reduce adhesion between the frame member 51 and the land portion 53a. Moreover, if applied to an RF unit, the conventional structure involves a problem of low shielding effect because of the opening 51b.

SUMMARY OF THE INVENTION

The present invention has been accomplished in view of the above-described problems of the conventional technique. Accordingly, it is an object of the present invention to provide a coupling structure between a circuit board and a frame member, which secures a sturdy coupling structure and a high shielding effect.

In order to attain the above object, a coupling structure between a circuit board and a frame member according to an aspect of the present invention includes: the frame member made of a metal material; and the circuit board set in the frame member and having a land portion soldered to the frame member, in which a solder reinforcing member that is put on the land portion and is solderable is provided at a corner formed by the frame member and the circuit board, and the frame member, the land portion, and the solder reinforcing member are soldered at the corner.

According to the coupling structure of the present invention, since the solder reinforcing member is provided at the corner, a clearance for enhancing a capillarity effect is ensured between the solder reinforcing member and the frame member and between the solder reinforcing member and the land portion. The solder flows into the clearance, making it possible to reinforce the coupling structure between the frame member, the land portion, and the solder reinforcing member and to omit an opening of the frame member. Hence, if the coupling structure of the present invention is applied to a RF unit, a high shielding effect is obtained.

Further, in the coupling structure between a circuit board and a frame member of the present invention, the solder reinforcing member is preferably made up of chip parts.

According to the coupling structure of the present invention, the chip parts can be downsized and easily manufactured. In addition, it is possible to reduce a circuit board area occupied by the chip parts and to increase an effective area of the circuit board.

Further, in the coupling structure between a circuit board and a frame member of the present invention, the solder reinforcing member is preferably made up of a metal element.

According to the coupling structure of the present invention, the metal element can be obtained by cutting a wire rod, and the solder reinforcing member can be manufactured at low costs.

Further, in the coupling structure between a circuit board and a frame member of the present invention, the solder reinforcing member is preferably formed into a cylindrical shape or a rectangular column shape.

According to the coupling structure of the present invention, the solder reinforcing member can be easily formed with an elongate shape, and a sturdy coupling structure is obtained.

Further, in the coupling structure between a circuit board and a frame member of the present invention, the soldering between the frame member, the land portion, and the solder reinforcing member is preferably executed by melting a cream solder applied to the corner with a reflow soldering device.

According to the coupling structure of the present invention, the circuit board can be bonded to the frame member only by transferring the structure to the reflow soldering device, and its productivity can be increased.

According to the present invention, since the solder reinforcing member is provided at the corner, a clearance for enhancing a capillarity effect is ensured between the solder reinforcing member and the frame member and between the solder reinforcing member and the land portion. The solder flows into the clearance, making it possible to reinforce the coupling structure between the frame member, the land portion, and the solder reinforcing member and to omit an opening of the frame member. Hence, if the coupling structure of the present invention is applied to a RF unit, a high shielding effect is obtained.

DESCRIPTION OF THE PREFERRED EMBODIMENTS

Figure 1:
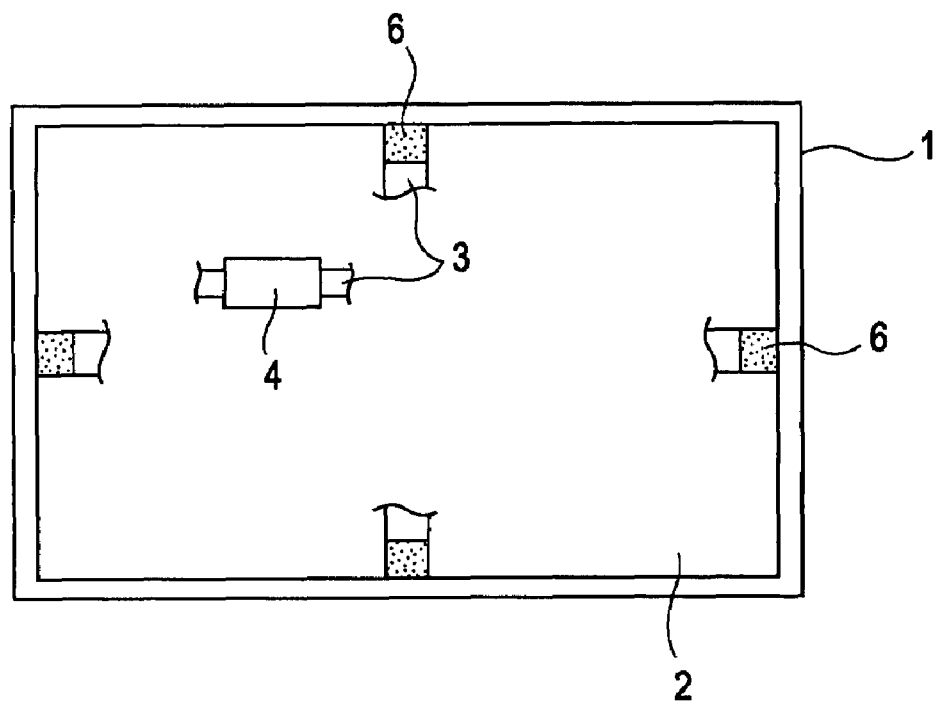
FIG. 1 is a plan view of a coupling structure between a circuit board and a frame member according to an embodiment of the present invention.

Hereinafter, an embodiment of the present invention will be described with reference to the accompanying drawings. FIG. 1 is a plan view of a coupling structure between a circuit board and a frame member according to the present invention, FIG. 2 is an enlarged plan view of a main portion of the coupling structure between a circuit board and a frame member according to the present invention, and FIG. 3 is an enlarged sectional view of a main portion of the coupling structure between a circuit board and a frame member according to the present invention.

Figure 2:
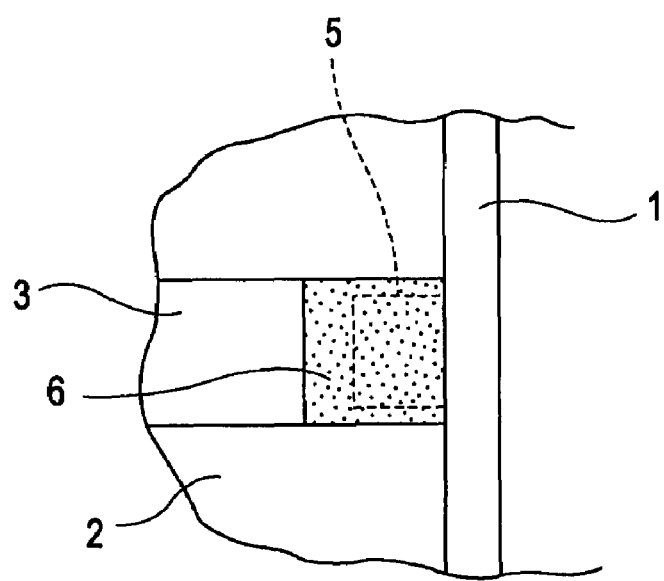
FIG. 2 is an enlarged plan view of a main portion of the coupling structure between a circuit board and a frame member according to the embodiment of the present invention.
Figure 3:
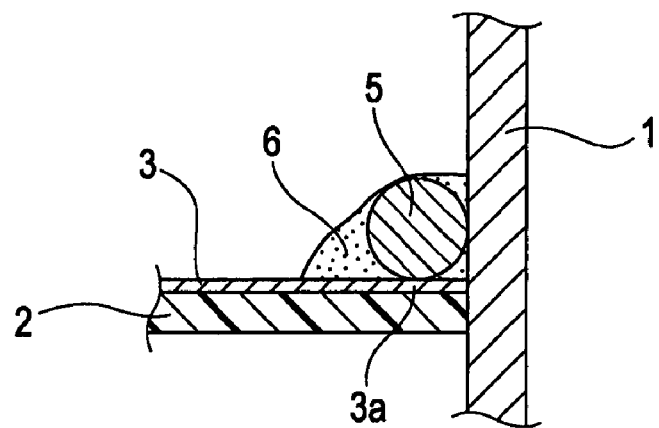
FIG. 3 is an enlarged sectional view of a main portion of the coupling structure between a circuit board and a frame member according to the embodiment of the present invention.
Figure 4:
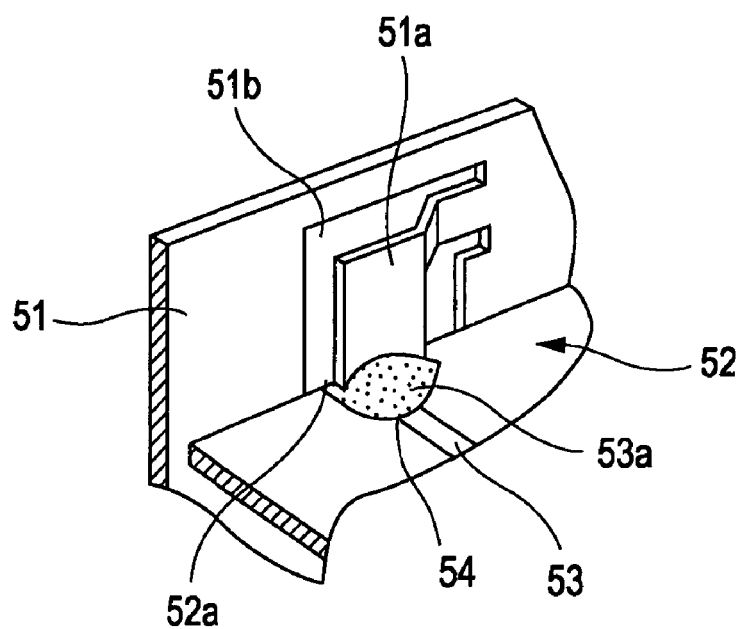
FIG. 4 is a perspective view of a conventional coupling structure between a circuit board and a frame member.

Referring next to FIGS. 1 to 3, the coupling structure between a circuit board and a frame member according to the present invention is described. A frame member 1 is made of a rectangular solderable metal material and molded into a hollow square shape.

In a circuit board 2, a desired electric circuit is formed with a wiring pattern 3 having a land portion 3a extending up to the end of the circuit board 2 and various electronic parts 4 on the wiring pattern 3.

The circuit board 2 is set in the frame member 1 and fixed thereto with appropriate means of the frame member 1. In addition, a solder reinforcing member 5 that is solderable and made up of chip parts as cylindrical metal elements is put on the land portion 3a at the corner formed by the frame member 1 and the circuit board 2. The frame member 1, the land portion 3a, and the solder reinforcing member 5 are bonded together with a solder 6 to thereby complete the coupling structure between a circuit board and a frame member of the present invention.

That is, owing to the solder reinforcing member 5 at the corner, a clearance for enhancing a capillarity effect is ensured between the solder reinforcing member 5 and the frame member 1 and between the solder reinforcing member 5 and the land portion 3a. As a result, the solder 6 flows into the clearance to thereby reinforce the coupling structure between the frame member 1, the land portion 3a, and the solder reinforcing member 5.

Incidentally, the above embodiment describes the solder reinforcing member 5 as the metal element. However, the solder reinforcing member 5 may be structured such that a solderable metal film is formed on the outer circumferential surface of an insulator made of ceramics or the like. In addition, the solder reinforcing member 5 may be formed into an elliptical cylinder, a tube, a triangle pole, a square pole, a pentagonal or further pole, or a ball aside from the cylinder.

Further, in the coupling structure between a circuit board and a frame member of the present invention, a cream solder (not shown) is applied onto the solder reinforcing member 5 in such a state that the solder reinforcing member 5 is put on the land portion 3a at the corner. Under such conditions, the structure is transferred to a reflow soldering device (not shown) where the cream solder is melt. The reinforcing member is thereby bonded to a target portion with the solder 6.

What is claimed is:

1. A coupling structure between a circuit board and a fame member, comprising:
   the frame member made of a metal material; and
   the circuit board set in the frame member and having a land portion soldered to the frame member,
   wherein a solder reinforcing member that is put on the land portion and is solderable is provided at a corner formed by the frame member and the circuit board,
   wherein the solder reinforcing member is formed into a cylindrical shape having longitudinal axis disposed horizontally with respect to the planar surface of the circuit board, and
   wherein a clearance formed by the frame member, the land portion, and the solder reinforcing member is soldered.

2. The coupling structure between a circuit board and a frame member according to claim 1, wherein the solder reinforcing member is made up of chip parts.

3. The coupling structure between a circuit board and a frame member according to claim 1, wherein the solder reinforcing member is made up of a metal element.

4. The coupling structure between a circuit board and a frame member according to claim 1, wherein the soldering between the frame member, the land portion, and the solder reinforcing member is executed by melting a cream solder applied to the corner with a reflow soldering device.

5. A coupling structure between a frame member and a circuit board set in the frame member, the frame member being made of a metal material, the circuit board having a land portion to be soldered to the frame member, the coupling structure comprising:
   a solder reinforcing member which is solderable and disposed on the land portion at a corner formed by the frame member and the circuit board, the solder reinforcing member having a cylindrical shape having longitudinal axis being disposed horizontally with respect to the planar surface of the circuit board such that a clearance is formed by the frame member, the land portion, and the solder reinforcing member; and a solder bonding the frame member, the land portion, and the solder reinforcing member, the solder filling the clearance formed by the frame member, the land portion, and the solder reinforcing member at the corner.

* * * * *